United States Patent
Helmstetter et al.

(10) Patent No.: US 7,175,878 B2
(45) Date of Patent: Feb. 13, 2007

(54) COLD ANTIREFLECTION LAYER DEPOSITION PROCESS

(75) Inventors: Yvon Helmstetter, ruelle Boutet Boviolles (FR); Jean-Daniel Bernhard, Longeville en Barrois Bar-le-Duc (FR); Frederic Arrouy, Verdun (FR)

(73) Assignee: Essilor International (FR)

( * ) Notice: Subject to any disclaimer, the term of this patent is extended or adjusted under 35 U.S.C. 154(b) by 0 days.

(21) Appl. No.: 10/432,662

(22) PCT Filed: Nov. 26, 2001

(86) PCT No.: PCT/FR01/03723

§ 371 (c)(1),
(2), (4) Date: Dec. 3, 2003

(87) PCT Pub. No.: WO02/44440

PCT Pub. Date: Jun. 6, 2002

(65) Prior Publication Data

US 2004/0067351 A1   Apr. 8, 2004

(30) Foreign Application Priority Data

Nov. 28, 2000 (FR) .................................. 00 15334

(51) Int. Cl.
*B05D 5/06* (2006.01)

(52) U.S. Cl. ................... 427/162; 427/164; 427/248.1; 427/298; 427/255.23; 427/255.28; 427/255.395; 427/255.39; 427/255.7; 427/534; 427/535; 427/551; 427/533; 423/490; 359/580; 359/581; 359/582; 351/159; 351/163; 351/158; 351/177

(58) Field of Classification Search ................ 427/534, 427/535, 536, 551, 162, 164, 248.1, 255.23, 427/255.28, 255.395, 255.7, 296, 533, 255.39; 423/490; 359/580–582; 351/159, 163, 166, 351/177

See application file for complete search history.

(56) References Cited

U.S. PATENT DOCUMENTS

| 3,330,681 A |   | 7/1967 | Scharf et al. ............... 117/33.3 |
| 4,607,087 A | * | 8/1986 | Moriya et al. ............... 526/227 |
| 5,316,791 A | * | 5/1994 | Farber et al. ............... 427/164 |
| 5,764,416 A | * | 6/1998 | Rahn ........................... 359/586 |
| 5,783,299 A | * | 7/1998 | Miyashita et al. ........... 428/329 |
| 5,920,431 A | * | 7/1999 | Tokuhiro et al. ............ 359/586 |
| 5,939,189 A | * | 8/1999 | Phillips et al. .............. 428/336 |
| 6,200,684 B1 | * | 3/2001 | Yamaguchi et al. ......... 428/447 |
| 2002/0008847 A1 | * | 1/2002 | Ayoub ......................... 351/174 |

FOREIGN PATENT DOCUMENTS

EP      0 619 504 A1    10/1994

(Continued)

*Primary Examiner*—Alain L. Bashore
(74) *Attorney, Agent, or Firm*—Fish & Richardson P.C.

(57) ABSTRACT

The invention concerns a method for making an antiglare stack by vacuum evaporation on an organic substrate (1) at a temperature lower than 150° C., comprising steps which consist in depositing at least a layer of material having a refractive index different from that of $MgF_2$ (4, 4'), preparing the surface of the thus coated substrate, and depositing an outer $MgF_2$ layer (5) without ionic assistance. The resulting antiglare stack on organic substrate exhibits good adherence and good scratch resistance. The invention is applicable to ophthalmic lenses.

18 Claims, 1 Drawing Sheet

FOREIGN PATENT DOCUMENTS

| | | |
|---|---|---|
| FR | 2 702 486 | 9/1994 |
| JP | 60-22101 | 2/1985 |
| JP | 60-129702 A * | 7/1985 |
| JP | 61-250601 | 11/1986 |
| JP | 62-186203 A * | 8/1987 |
| JP | 63-228101 | 9/1988 |
| JP | 7-27902 | 1/1995 |
| JP | 7-76048 | 3/1995 |
| JP | 07-076048 A * | 3/1995 |
| JP | 8-41230 | 2/1996 |
| JP | 8-236635 | 9/1996 |
| JP | 10-123303 | 5/1998 |
| JP | 10-123303 A * | 5/1998 |
| WO | WO 99/49097 | 9/1999 |

* cited by examiner

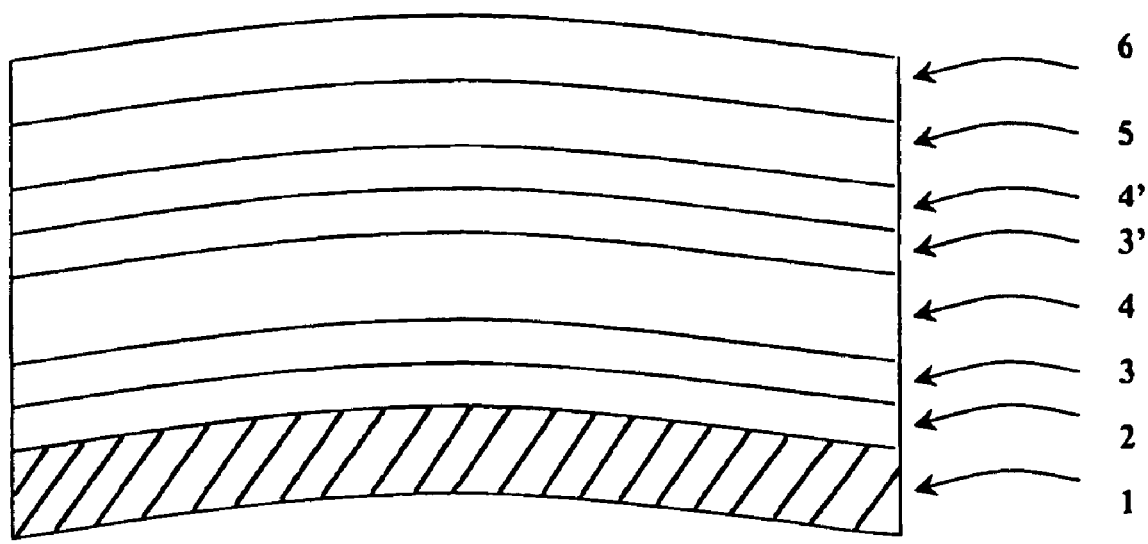

COLD ANTIREFLECTION LAYER DEPOSITION PROCESS

BACKGROUND OF THE INVENTION

The present invention relates to a process for carrying out an antireflection treatment on a substrate made of an organic material, in particular an ophthalmic lens, using a technique of deposition by vacuum evaporation. Such coatings are generally produced by means of metal oxides having high and low refractive indices.

The effectiveness of an antireflection treatment depends to a great extent on the value of the refractive indices of the layers deposited. The constraints associated with the type of deposition used and the nature of the substrates to be treated restrict the materials that can be used for these treatments.

Manufacturers are being required to devise antireflection treatments of ever higher performance. For information, in the ophthalmic field, the effectiveness of such a treatment is given in terms of reflection per face, which lies between 1.6 and 2.5% for a poorly effective treatment, is between 1.0 and 1.8% for a moderately effective treatment and must nowadays be between 0.3 and 0.8% for a highly effective treatment.

These constraints mean that novel materials have to be sought, these sometimes being difficult to develop from an industrial standpoint. Another approach may consist in using materials previously reserved for substrates made of inorganic material.

To produce a highly effective antireflection treatment, it is necessary for the last layer deposited to have the lowest possible refractive index. In the case of organic substrates, $SiO_2$ is often used because of its refractive index of 1.48, its good adhesion, scratch resistance and corrosion resistance properties and its ease of deposition.

$MgF_2$ is very widely used for substrates made of an inorganic material because of its very low refractive index, namely 1.38. A drawback of this material lies in its friability and its lack of adhesion when it is deposited at temperatures below 200° C.

In general, $MgF_2$ is not used for organic substrates as these cannot be heated above 150° C. as they undergo yellowing and deterioration.

It is therefore necessary to find a process allowing deposition of $MgF_2$ on an organic substrate ("cold" deposition) and to find other materials which might be suitable.

JP 8-236635 teaches the deposition of an $MgF_2$ layer on an organic substrate by means of the technology of sputtering. However, the layers deposited by sputtering have particular physico-chemical characteristics. In particular, the layers deposited are generally denser, which poses an adhesion problem. The document teaches that such deposition carried out by means of vacuum evaporation results in layers having a low degree of crystallization, which entails an insufficient abrasion resistance.

A multilayer antireflection coating on an organic material in the ophthalmic field, the final layer of which is made of $MgF_2$, is also disclosed in the document EP-A-619 504. That document indicates that the layers disclosed are produced by plasma-enhanced processes and within certain unspecified limits by sputtering. The most economic and most widely used deposition process is however non-plasma-enhanced vacuum evaporation. Layers obtained by plasma-enhanced evaporation furthermore have a higher density than those obtained without enhancement, but high density means that these layers are highly strained, which may result in adhesion of inferior quality.

Document JP 61250601 also discloses a multilayer antireflection coating on an organic substrate. According to that document, $SiO_2$ is used as the outer layer of low refractive index and preferably a multilayer coating consisting of three layers of the $Y_2O_3/TiO_2/SiO_2$ type is used. During deposition of the multilayer coating, the interface of at least one of the layers is treated by ion bombardment. This treatment improves the adhesion of the layers. The use of $MgF_2$ as material having a low refractive index is neither disclosed nor suggested in that document.

Document JP 7076048 discloses a multilayer antireflection coating deposited on an organic substrate. This specifies that the outer layer, made of $MgF_2$, is deposited at low temperature with ion assistance using the IAD (Ion Assisted Deposition) technique and that surface on which this layer is deposited is subjected beforehand to a cleaning treatment by ion bombardment and/or by plasma. However, it turns out that the use of the IAD technique has a number of drawbacks. This type of assistance is generally used to densify the layers deposited. But on the downside, the densest layers have lower adhesion. Furthermore, ion assistance may make the $MgF_2$ layer more absorbent, this being a troublesome drawback in the case of ophthalmic applications. Finally, this type of assistance makes the process more complicated and increases the production costs substantially.

SUMMARY OF THE INVENTION

The invention therefore consists in providing a process for manufacturing a multilayer antireflection coating by vacuum evaporation on an organic substrate at a temperature below 150° C., comprising the following steps: deposition of at least one layer of material of refractive index different from $MgF_2$; preparation of the surface of the substrate thus coated; and deposition of an outer layer of $MgF_2$ without ion assistance. Preferably, the vacuum evaporation is carried out at a temperature below 100° C.

Preferably, the surface preparation is chosen from among the following treatments: ion bombardment, electron bombardment and etching carried out ex situ.

According to a preferred embodiment, said layer consists of a material having a high refractive index chosen from a group of simple or mixed oxides or mixtures of oxides of metals of groups IIIb, IVb, Vb, Vib, VIIb and lanthanides. Preferably, the metals are chosen from the group Pr, La, Ti, Zr, Ta and Hf. Also preferred are materials having a high refractive index chosen from the group consisting of $ZrO_2$, $PrTiO_3$, $Pr_2O_3/TiO_2$ mixtures, $Pr_6O_{11}/TiO_2$ mixtures, $La_2O_3/TiO_2$ mixtures and $ZrO_2/TiO_2$ mixtures.

According to one embodiment, said layer of material of refractive index different from $MgF_2$ is a hard coating. According to another embodiment, said layer of material of refractive index different from $MgF_2$ is an impact-resistant layer. According to yet another embodiment, said layer of material of refractive index different from $MgF_2$ is an antifringe layer.

Preferably, the process comprises, before the layer of material of refractive index different from $MgF_2$ is deposited, the prior step of depositing a layer of low refractive index. Preferably, the layer of low refractive index has a thickness of between 40 and 200 nm, preferably 60 nm.

According to one embodiment, the step of depositing the material of refractive index different from $MgF_2$ comprises the following steps: deposition of a first layer of material of refractive index different from $MgF_2$; deposition of a layer of material having a low refractive index; and deposition of a second layer of material of refractive index different from $MgF_2$.

Preferably, the layer having a low refractive index is made of $SiO_2$. It is preferred for the first layer of material of refractive index different from $MgF_2$ to have a thickness of 10 to 40 nm. It is also preferred for the layer of low refractive index to have a thickness of 10 to 100 nm, preferably 40 nm.

Advantageously, the second layer of material of refractive index different from $MgF_2$ has a thickness of 50 to 150 nm, preferably 120 to 130 nm.

The organic substrate is preferably composed of polycarbonate.

Preferably, the outer layer of $MgF_2$ has a thickness of 50 to 100 nm, preferably 80 to 90 nm.

The process according to the invention preferably comprises the subsequent step of depositing a layer that modifies surface energy.

The invention also relates to the use of the process according to the invention to improve the adhesion of a multilayer antireflection coating that includes $MgF_2$ on the substrate.

The invention also relates to an organic substrate coated with a multilayer antireflection coating, in particular an ophthalmic lens that can be obtained by the process according to the invention.

Further features and advantages of the invention will become apparent on reading the following description of embodiments of the invention, these being given as examples and with reference to the appended drawing.

BRIEF DESCRIPTION OF THE DRAWINGS

The single FIGURE, a multilayer antireflection coating obtained according to one embodiment of the invention.

DETAILED DESCRIPTION OF PREFERRED EMBODIMENTS

The studies and trials undertaken by the Applicant in the field of $MgF_2$ deposition on organic substrates by vacuum evaporation have resulted in the observation that, contrary to the teaching of the literature, it is possible to produce such layers by vacuum evaporation without recourse to ion assistance.

One advantage of the process according to the invention lies in the fact that it allows these layers to be deposited more economically.

Another advantage of the process according to the invention is that it makes it possible to obtain organic substrates comprising layers having the same physico-chemical characteristics as those deposited on inorganic substrates.

The invention furthermore makes it possible to obtain multilayer antireflection coatings on organic substrates which have the required characteristics, especially in terms of adhesion, but also in terms of scratch resistance.

An example of a multilayer coating that can be obtained by the process according to the invention is illustrated in the FIGURE and described below (the refractive indices are given for a wavelength of 550 nm and the thicknesses given are physical thicknesses).

Within the context of the invention, the term "organic substrates" is understood to mean substrates made of polymer materials, in contrast with substrates made of glass. Particularly intended are substrates made of polycarbonate, polymethyl methacrylate, polythiourethane and poly (bisphenol-A-bisallyl carbonate) and in particular poly(diethylene glycol bisallyl carbonate), commercially available under the name CR39.

According to the embodiment illustrated in the FIGURE, an organic substrate (1) is provided with a hard coating (2), also called a hard coat. This hard coating typically has a thickness of between 300 and 10,000 nm. In general, it is composed of silica or a varnish, for example an epoxide or polysiloxane varnish. It is also possible to apply a plasma polymerization layer, preferably also composed of a polysiloxane, and/or a DLC (diamonid-like coating) film. However, this hard coating is not obligatory.

The multilayer antireflection coating deposited according to the invention includes a layer (4) of a material having a refractive index different from that of $MgF_2$. This material may, for example, be a varnish or $SiO_2$.

According to a preferred embodiment, this layer is made of a material having a high refractive index. Within the context of the invention, the expression "material having a high refractive index" denotes materials having a refractive index greater than 1.6 and preferably from 2 to 2.6. In practice, materials of high refractive index, from 1.9 to 2.3, are usually employed for the multilayer antireflection coatings.

Such materials having a high refractive index suitable for implementing the process according to the invention are, for example, simple or mixed oxides or mixtures of oxides of metals of groups IIIb, IVb, Vb, VIb, VIIb and lanthanides. Preferably, simple or mixed oxides or mixtures of oxides of the metals Pr, La, Ti, Zr, Ta, and Hf are used, of which $ZrO_2$, $PrTiO_3$, $Pr_2O_3/TiO_2$ mixtures, $Pr_6O_{11}/TiO_2$ mixtures, $La_2O_3/TiO_2$ mixtures and $ZrO_2/TiO_2$ mixtures are particularly preferred.

The layer made of material having a high refractive index may, however, itself consist of a multilayer coating comprising other layers. Thus, in the multilayer coating according to the embodiment illustrated in the figure, the layer (4) of a material having a high refractive index is divided into two layers (4) and (4') separated by a layer (3') made of a material having a low refractive index. Advantageously, the layers (4) and (4') of material having a high refractive index may consist of the same material.

The layer (4) made of a material having a high refractive index may also be divided into a larger number of layers separated by layers of materials having a lower refractive index.

The layers (3) and (3') having a low refractive index present in the multilayer coating obtained according to the embodiment illustrated may be a material whose refractive index is less than that of the substrate, particularly less than 1.5. Such materials are, for example, $SiO_2$, or metal fluorides, $SiO_2$ being preferred. Advantageously, the layers (3) and (3') consist of the same material.

The multilayer antireflection coating obtained according to the invention comprises an outer layer (5) of low refractive index formed from $MgF_2$. The teaching of the literature indicates that this material is difficult to deposit with satisfactory characteristics by techniques compatible with organic materials, that is to say at low temperature. However, it has been found that deposition without ion assistance on a lower layer that has undergone a preparation results in substrates of remarkable quality.

This preparation step according to the invention may, for example, be a treatment by ion bombardment, electron bombardment or etching carried out ex situ.

In the multilayer coating obtained according to one embodiment of the invention, the $MgF_2$ is deposited with a thickness of 50 to 100 nm, preferably 80 to 90 nm.

It is possible to deposit, on top of the $MgF_2$ outer layer, one or more layers (6) for modifying the surface energy so as to facilitate cleaning and/or a layer for reducing the electrostatic effect, such as for example a conducting layer.

It has been found that the process according to the invention, especially by virtue of the step of preparing the substrate possibly already coated with other layers before the $MgF_2$ is deposited, allows multilayer antireflection coatings to be obtained which have very satisfactory characteristics from the standpoint of adhesion, scratch resistance, resistance to chemical attack and ease of cleaning.

EXAMPLES

To characterize the multilayer antireflection coatings obtained according to the process of the invention, multilayer antireflection coatings were manufactured on organic substrates (CR39) with various materials having a high refractive index.

The substrates were coated with a multilayer coating consisting of four layers of the $SiO_2/HI/SiO_2/HI/MgF_2$/top coat type (where HI denotes a material having a high refractive index).

The process according to the invention was carried out in a vacuum evaporator of the Balzers BAK 760 type.

The various HI materials used are given in the table below. The respective suppliers are indicated in brackets. For each of the materials having a high refractive index, a substrate was produced by subjecting the last layer of HI material to ion bombardment under a voltage of 100 V, a current of 1 A for 1 minute and in the presence of argon as gas, but a second substrate was not treated by ion bombardment. Next, $MgF_2$ was deposited by vacuum evaporation, without ion assistance.

In the examples given, the substrates were coated with a varnish based on silane hydrolysates, as described in French Patent FR 2 702 486 by the Applicant and more particularly described in example 3.

The outer layer, which makes cleaning easier, is a material of the hydrophobic fluoroorganosilane type. As an example, a material sold by Opton under the name OF 110 was used to produce this layer.

The substrates thus obtained were then subjected to a series of tests so as to evaluate their performance.

The substrates were subjected to the test called the N×10 blows and described in the application WO99/49097. This test stressed the adhesion of the thin layers deposited on an organic substrate. The results are given in Table 1, in which concave faces (CC) are distinguished from the convex faces (CX) of the substrates. It may be seen that the substrates manufactured according to the process of the invention give results at least comparable, and for most part superior, to materials having a high refractive index.

The substrates were also subjected to the test called the "steel wool" test. This test was carried out using starwax No. 000 extra-fine steel wool. Approximately 3 cm of steel wool was folded over on itself and applied to the coated substrate with a constant pressure. After making 5 to-and-fro movements, the state of the substrate was assessed visually and a rating assigned according to the following gradation:

1 intact substrate, no scratching or fine localized scratches present;

3 substrate with more intense scratches and slight tearing (white scratches);

5 substrate with white scratches covering almost the entire surface tested (tearing of the varnish or of the corresponding substrate). The result obtained corresponds to that of the steel wool test applied to the non-varnish CR 39.

TABLE 1

| HI material | N × 10 blows, according to the invention | | N × 10 blows, comparison | | Steel wool, according to the invention | Steel wool, comparison |
|---|---|---|---|---|---|---|
| | CC | CX | CX | CC | | |
| $PrTiO_{3(Bea\ Merck)}$ | >12 | >12 | >12 | >12 | 1.2 | 5 |
| $Pr_6O_{11}/TiO_2$ mixture$_{(Cerac)}$ | >12 | >12 | | | 1.3 | |
| $LaTiO_{3(H4\ Merck)}$ | >12 | >12 | >12 | >12 | 1.4 | 3 |
| $La_2O_3/TiO_2$ mixture$_{(Aldrich)}$ | >12 | >12 | >12 | >12 | 1 | |
| $ZrO_{2(Optron)}$ | >12 | >12 | >12 | >12 | 1.2 | 5 |
| $ZrO_2/TiO_2$ mixture$_{(OM4\ from\ Optron)}$ | >12 | >12 | >12 | 9 | 2 | 5 |
| $TiO_{2(Merck)}$ | >12 | >12 | 3 | 3 | 3 | 5 |
| $Ta_2O_{5(Merck-Optron)}$ | >12 | >12 | 9 | 9 | 3 | 5 |
| $HfO_{2(Merck-Optron)}$ | >12 | >12 | 3 | 3 | 3 | 5 |

Substrates with a rating up to 3 were accepted, those up to 5 were rejected. The test was carried out for 5 to 10 substrates each time, and the average of the results is given in Table 1.

It may be seen that the results of the steel wool test are very satisfactory in the case of the substrates that have undergone the ion bombardment, whereas all of the other substrates give poor results. The $PrTiO_3$, $Pr_6O_{11}/TiO_2$ mixture, $LaTiO_3$, $La_2O_3/TiO_2$ mixture, $ZrO_2$ and $ZrO_2/TiO_2$ mixture materials give particularly remarkable results.

In conclusion, for all of the materials tested given in the Table, the performance obtained in the N×10 blow and steel wool tests are good and meet the Essilor standard.

It is apparent from these observations that we have identified a cold deposition process for depositing $MgF_2$ on an organic substrate which does not require the use of IAD. This process furthermore makes it possible to deposit $MgF_2$ layers having properties equivalent to those of layers deposited hot.

The organic substrate coated with a multilayer antireflection coating according to the invention can be used in various fields, especially in optics. It is most particularly useful in the manufacture of ophthalmic lenses.

What is claimed is:

1. A process for manufacturing a multilayer antireflection coating, the process comprising the following steps:
    deposition of a first layer of material of refractive index different from $MgF_2$;
    deposition of a layer of material having a low refractive index;
    deposition of a second layer of material of refractive index different from $MgF_2$, and having a thickness of 120 to 130 nm;
    preparation of a surface of an organic substrate thus coated with a surface preparation selected from a group consisting of ion bombardment, electron bombardment and etching carried out ex situ; and
    deposition of an outer layer of $MgF_2$ without ion assistance;
    wherein the depositions take place by vacuum evaporation on the substrate at a temperature below 150° C.

2. The process as claimed in claim 1, in which the vacuum evaporation is carried out at a temperature below 100° C.

3. The process as claimed in claim 2, in which said layer of material of refractive index different from $MgF_2$ is made of a material having a high refractive index chosen from a group of simple or mixed oxides or mixtures of metals of groups IIIb, IVb, Vb, VIb, VIIb and lanthanides.

4. The process as claimed in claim 3, in which the metals are chosen from the group consisting of Pr, La, Ti, Zr, Ta and Hf.

5. The process as claimed in claim 3, in which the materials having a high refractive index are chosen from the group consisting of $ZrO_2$, $PrTiO_3$, $Pr_2O_3/TiO_2$ mixtures, $Pr_6O_{11}/TiO_2$ mixtures, $La_2O_3/TiO_2$ mixtures and $ZrO_2/TiO_2$ mixtures.

6. The process as claimed in claim 1, wherein said layer of material of refractive index different from $MgF_2$ is a hard coating.

7. The process as claimed in claim 1, wherein said layer of material of refractive index different from $MgF_2$ is an impact-resistant layer.

8. The process as claimed in claim 1, wherein said layer of material of refractive index different from $MgF_2$ is an antifringe layer.

9. The process as claimed in claim 7, wherein said layer of material of refractive index different from $MgF_2$ is an antifringe layer.

10. The process as claimed in claim 1, in which the layer of low refractive index has a physical thickness of between 40 and 200 nm.

11. The process as claimed in claim 1, in which the layer having a low refractive index is made of $SiO_2$.

12. The process as claimed in claim 1, in which the first layer of material of refractive index different from $MgF_2$ has a physical thickness of 10 to 40 nm.

13. The process as claimed in claim 11, in which the first layer of material of refractive index different from $MgF_2$ has a physical thickness of 10 to 40 nm.

14. The process as claimed in claim 1, in which the layer of material having a low refractive index has a thickness of 10 to 100 nm.

15. The process as claimed in claim 1, in which the organic substrate comprises polycarbonate.

16. The process as claimed in claim 1, in which the outer layer of $MgF_2$ has a physical thickness of 50 to 100 nm.

17. The process as claimed in claim 1, comprising the subsequent step of depositing a layer that modifies surface energy.

18. A process for manufacturing a multilayer antireflection coating, the process comprising the following steps:
    deposition of a first layer of material of refractive index different from $MgF_2$;
    deposition of a layer of material having a low refractive index;
    deposition of a second layer of material of refractive index different from $MgF_2$, and having a thickness of 120 to 130 nm;
    preparation of a surface of an organic substrate thus coated with a surface preparation selected from a group consisting of ion bombardment, electron bombardment and etching carried out ex situ; and
    deposition of an outer layer of $MgF_2$ without ion assistance to improve the adhesion of a multilayer antireflection coating that includes $MgF_2$ on the substrate;
    wherein the depositions take place by vacuum evaporation on the substrate at a temperature below 150° C.

* * * * *